US008561005B2

(12) United States Patent
Durbha et al.

(10) Patent No.: US 8,561,005 B2
(45) Date of Patent: Oct. 15, 2013

(54) PROGRAMMATIC AUTO-CONVERGENT METHOD FOR PHYSICAL DESIGN FLOORPLAN AWARE RE-TARGETABLE TOOL SUITE GENERATION (COMPILER-IN-THE-LOOP) FOR SIMULTANEOUS INSTRUCTION LEVEL (SOFTWARE) POWER OPTIMIZATION AND ARCHITECTURE LEVEL PERFORMANCE OPTIMIZATION FOR ASIP DESIGN

(75) Inventors: Ananth Durbha, San Jose, CA (US); Pius Ng, Hillsboro, OR (US); Gary Oblock, Santa Clara, CA (US); Suresh Kadiyala, Cupertino, CA (US); Satish Padmanabhan, Sunnyvale, CA (US)

(73) Assignee: Algotochip Corp., Sunnyvale, CA (US)

( * ) Notice: Subject to any disclaimer, the term of this patent is extended or adjusted under 35 U.S.C. 154(b) by 0 days.

(21) Appl. No.: 13/452,891

(22) Filed: Apr. 22, 2012

(65) Prior Publication Data

US 2013/0111426 A1    May 2, 2013

Related U.S. Application Data

(63) Continuation of application No. 12/835,640, filed on Jul. 13, 2010, now Pat. No. 8,185,862.

(51) Int. Cl.
*G06F 9/455* (2006.01)
*G06F 17/50* (2006.01)

(52) U.S. Cl.
USPC ............ 716/133; 716/109; 716/127; 716/132

(58) Field of Classification Search
USPC .................................. 716/132, 133, 109, 127
See application file for complete search history.

(56) References Cited

U.S. PATENT DOCUMENTS

| | | | | |
|---|---|---|---|---|
| 8,037,443 B1 * | 10/2011 | Krishnaswamy et al. | ..... | 716/133 |
| 8,381,151 B1 * | 2/2013 | Rochel et al. | ................ | 716/109 |
| 8,402,419 B1 * | 3/2013 | Plofsky et al. | ................ | 716/132 |
| 8,468,510 B1 * | 6/2013 | Sundararajan et al. | ........ | 717/152 |
| 2005/0204316 A1 * | 9/2005 | Nebel et al. | ....................... | 716/2 |
| 2007/0083839 A1 * | 4/2007 | Lahner et al. | ................... | 716/11 |

* cited by examiner

*Primary Examiner* — Vuthe Siek
*Assistant Examiner* — Brian Ngo
(74) *Attorney, Agent, or Firm* — Tran & Associates

(57) ABSTRACT

Systems and methods are disclosed to automatically synthesize a custom integrated circuit by automatically generating an application specific instruction set processor architecture uniquely customized to the computer readable code with a compiler-in-the-loop to compile, assemble and link code for each processor architecture iteration, the processor architecture having one or more processing blocks on the IC executing one or more instructions; and synthesizing the generated architecture into a computer readable description of the custom integrated circuit for semiconductor fabrication.

20 Claims, 12 Drawing Sheets

PROGRAMMATIC AUTO-CONVERGENT METHOD FOR PHYSICAL DESIGN FLOORPLAN AWARE RE-TARGETABLE TOOL SUITE GENERATION (COMPILER-IN-THE-LOOP) FOR SIMULTANEOUS INSTRUCTION LEVEL (SOFTWARE) POWER OPTIMIZATION AND ARCHITECTURE LEVEL PERFORMANCE OPTIMIZATION FOR ASIP DESIGN

CROSS-REFERENCED APPLICATIONS

This application is a continuation of application Ser. No. 12/835,640, filed Jul. 13, 2010 now U.S. Pat. No. 8,185,862 which is related to commonly owned, concurrently filed application Ser. No. 12/835,603 entitled "AUTOMATIC OPTIMAL INTEGRATED CIRCUIT GENERATOR FROM ALGORITHMS AND SPECIFICATION", application Ser. No. 12/835,621 entitled "AUTOMATIC OPTIMAL INTEGRATED CIRCUIT GENERATOR FROM ALGORITHMS AND SPECIFICATION", application Ser. No. 12/835,628 entitled "APPLICATION DRIVEN POWER GATING", application Ser. No. 12/835,631 entitled "SYSTEM, ARCHITECTURE AND MICRO-ARCHITECTURE (SAMA) REPRESENTATION OF AN INTEGRATED CIRCUIT", and application Ser. No. 12/835,640 entitled "ARCHITECTURAL LEVEL POWER-AWARE OPTIMIZATION AND RISK MITIGATION", the contents of which are incorporated by reference.

BACKGROUND

The present invention relates to a method and apparatus for Architectural Level Power-Aware Optimization and Risk Mitigation.

The distribution of power is often as important as the level of power consumed in a product. Even with a lower level of power consumed, if the consumers are located in a confined area, this may cause significant voltage drop at this location. This subsequently causes the degradation in performance at that location. This is referred as a Voltage Drop/IR Hot Spot.

Typically, an architect develops an architecture from algorithm and/or product specification by partitioning the product into hardware and software. Then, designers translate the architecture into an intermediate code such as register transfer language (RTL) code. Floor planning is then done, and then an IC layout can be generated. After layout, a hot spot analysis can be done for the layout and if the hot-spot analysis indicates that IR hot spots arising from the current design are unacceptable, the user can restart the entire sequence of architecture, RTL, floor planning, layout and hot spot analysis. This process can be very lengthy and can cost millions of dollars depending on the complexity of the design.

SUMMARY

In a first aspect, systems and methods are disclosed to automatically synthesize a custom integrated circuit by automatically generating an application specific instruction set processor architecture uniquely customized to the computer readable code with a compiler-in-the-loop to compile, assemble and link code for each processor architecture iteration, the processor architecture having one or more processing blocks on the IC executing one or more instructions; and synthesizing the generated architecture into a computer readable description of the custom integrated circuit for semiconductor fabrication.

In another aspect, systems and methods are disclosed to automatically synthesize a custom integrated circuit by receiving a specification of the custom integrated circuit including computer readable code and generating a profile of the computer readable code to determine instruction usage; automatically generating a processor architecture uniquely customized to the computer readable code, the processor architecture having one or more processing blocks to implement one or more instructions; determining an instruction execution sequence based on the code profile and reassigning the instruction sequence to spread operation to different blocks on the IC to reduce hot spots; and synthesizing the generated processor chip specification into a computer readable description of the custom integrated circuit for semiconductor fabrication.

In yet another aspect, instead of reordering the execution sequence to spatially spread the operation on the IC, the process can determine an instruction execution sequence based on the code profile and spatially assigning the processing blocks to spread operation to different areas on the IC to reduce hot spots.

Implementations of the above aspects can include one or more of the following. The process associates every machine instruction with an associated hardware execution path, which is a collection of on-chip logic and interconnect structures. The execution path can be thought of as the hardware "foot-print" of the instruction. The data model maintains a record of all possible execution paths and their associated instructions. The data model receives a statistical profile of the various machine instructions and extracts from this a steady state probability that an instruction is executed in any given cycle. The data model can create an estimated topological layout for each instruction execution path. Layout estimation is performed using a variety of physical design models based on a pre-determined protocol to select the appropriate level of abstraction needed for the physical design modeling. The data model associates instructions' steady state probability of execution to the topology of its execution path. The data model creates sub-regions of the layout and for each sub-region there is a collection of intersecting execution paths which yields a collection of execution path probabilities which is used to compute a sub-region weight. The sub-region weight distribution (over the entire region) is used to estimate power hot-spot locations. The data model identifies impacted instructions whose execution paths intersect power hot-spots. Power hot-spot regions are then modeled as virtual restricted capacity resources. The data model arranges for instruction scheduler of the compiler to see the impacted instructions as dependent on the restricted capacity resources. Restricted capacity translates to limiting the number of execution paths in a sub-region that should be allowed to activate in close succession. Such a resource dependency can be readily added to resource allocation tables of an instruction scheduler. The instruction scheduler optimization will then consider the virtual resources created above in conjunction with other performance cost functions. Thus power and performance are simultaneously optimized. The system can generate functional block usage statistics from the profile. The system can track usage of different processing blocks as a function of time. The system can speculatively shut down power for one or more processing blocks and automatically switch power on for turned off processing blocks when needed. An instruction decoder can determine when power is to be applied to each power domain. Software tools for the custom IC to run the application code can be automatically generated. The tools include one or more of: Compiler, Assembler, Linker, Cycle-Based Simulator. The tool automatically generates firmware.

The tools can profile the firmware and providing the firmware profile as feedback to optimizing the architecture. The instruction scheduler of the compiler can arrange the order of instructions, armed with this power optimization scheme, to maximize the benefit. The system can iteratively optimize the processor architecture based on predetermined physical constraints. The system can perform static profiling or dynamic profiling of the computer readable code. The system can automatically generate a software development kit (SDK) for the custom integrated circuit to run the computer readable code. The computer readable code can be transformed into assembly code and linked to generate firmware for the selected architecture. The system can perform cycle accurate simulation of the firmware. The architecture can be optimized based on profiled firmware and/or the assembly code. The system can generate register transfer level code for the selected architecture, and thus for a physical design optimized in terms of timing, area, or power. The system can synthesize the RTL code.

Advantages of the preferred embodiments may include one or more of the following. The static power can be controlled from an architectural perspective. This would let chip designers get a better handle on the power consumed upfront and also avoid power related schedule delays. The system improves predictability in hot spot management through updating the cost function. This avoids surprise in hot spot induced sub-optimality. The instruction scheduler is made aware of power usage through the data model, and can see the true cost of scheduling instruction execution, resulting in high performance with minimal hot spots on the chip. Thus, the instruction scheduler is "power aware" in that the instruction scheduler can use predicted hot spot information and map this information to virtual resource constraints so that standard off-the-shelf instruction scheduler can become power aware.

In another aspect, systems and methods are disclosed to automatically synthesize a custom integrated circuit by receiving a specification of the custom integrated circuit including computer readable code and one or more constraints on the custom integrated circuit; encoding architecture level knowledge in a data model to pass information for physical synthesis of a chip specification uniquely customized to the computer readable code; iteratively performing physical synthesis and updating the data model of the chip specification until the constraints are satisfied; and synthesizing a computer readable description of the chip specification into the custom integrated circuit for semiconductor fabrication.

Implementation of the above aspect may include one or more of the following. The system can apply pre and post fix tags to indicate if the grouping of cells in a hierarchy is a hard or soft constraint. Names can be stored with certain pre/post fix to indicate a critical path from the architecture level knowledge. The system can indicate placement constraints for optimal timing with one of macro blocks name, hierarchy name, pragma, comment, dummy module, wrapper module. The system can perform look ahead to detect critical paths using information captured in the prior iteration or supplied by the user. The constraint can be one of: register transfer language (RTL) constraint, floor plan constraint, physical constraint, timing constraint, power constraint, system level constraint. Constraint information can be provided to the data model through a netlist instance naming protocol, among others.

Advantages of the preferred embodiments of the system may include one or more of the following. The system automates physical synthesis, which is the most detailed level design activity. In the initial design stages, real critical paths are masked by solvable critical paths. The system automatically determines which critical paths to optimize for and automatically unmask real critical paths. The system uses non-hierarchical design methods and hierarchical methods which analyze the complete circuit in a single run. This global approach brings design convergence as designers and tools focus on all aspects of the same circuit at all times. The system alleviates the problems of chip design and makes it a simple process. The embodiments shift the focus of product development process back from the hardware implementation process back to product specification and computer readable code or algorithm design. Instead of being tied down to specific hardware choices, the computer readable code or algorithm can be implemented on a processor that is optimized specifically for that application. The preferred embodiment generates an optimized processor automatically along with all the associated software tools and firmware applications. This process can be done in a matter of days instead of years as is conventional. The system is a complete shift in paradigm in the way hardware chip solutions are designed.

The instant system removes the risk and makes chip design an automatic process so that the algorithm designers themselves can directly make the hardware chip without any chip design knowledge. The primary input to the system would be the computer readable code or algorithm specification in higher-level languages like C or Matlab.

Of the many benefits, the benefits of using the system may include

1) Schedule: If chip design cycles become measured in weeks instead of years, the companies using The instant system can penetrate rapidly changing markets by bringing their products quickly to the market.
2) Cost: The numerous engineers that are usually needed to be employed to implement chips are made redundant. This brings about tremendous cost savings to the companies using The instant system.
3) Optimality: The chips designed using The instant system product have superior performance, Area and Power consumption.

The instant system is a complete shift in paradigm in methodology used in design of systems that have a digital chip component to it. The system is a completely automated software product that generates digital hardware from algorithms described in C/Matlab. The system uses a unique approach to the process of taking a high level language such as C or Matlab to realizable hardware chip. In a nutshell, it makes chip design a completely automated software process.

DESCRIPTION

Figure 1:
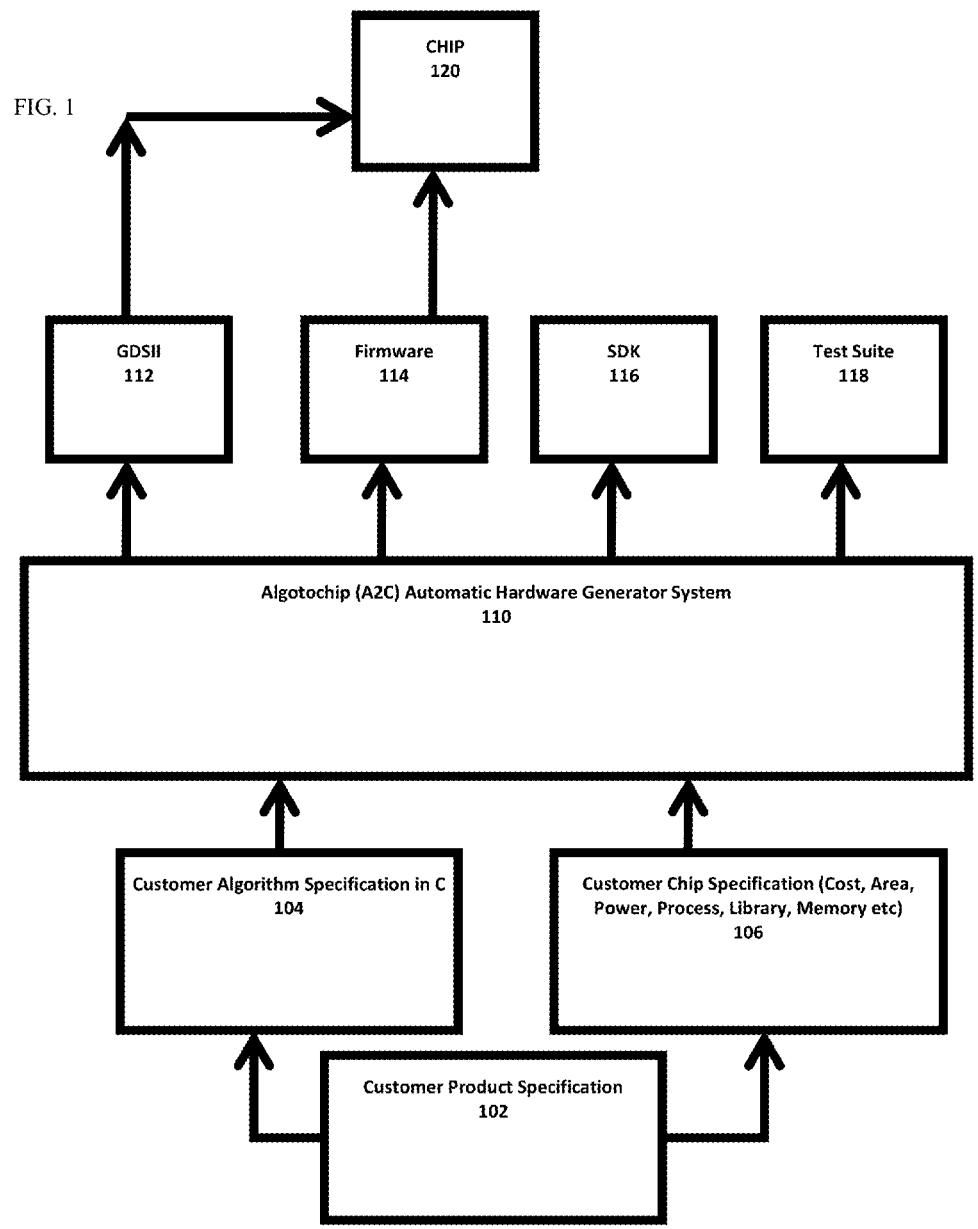
FIG. 1 shows an exemplary system to automatically generate a custom IC.

FIG. 1 shows an exemplary system to automatically generate a custom IC. The system of FIG. 1 supports an automatic generation of the optimal custom integrated circuit solution for the chosen target application. The target application specification is usually done through algorithm expressed as computer readable code in a high-level language like C, Matlab, SystemC, Fortran, Ada, or any other language. The specification includes the description of the target application and also one or more constraints such as the desired cost, area, power, speed, performance and other attributes of the hardware solution. To assist in physical synthesis, the system encodes "side-band" information to netlist file and can capture design constraints (physical as well timing) that are productive in guiding the physical synthesis than original user constraints alone can. In certain embodiments, such constraints are "implied" through a netlist instance naming scheme.

In FIG. 1, an IC customer generates a product specification 102. Typically there is an initial product specification that captures all the main functionality of a desired product. From the product, algorithm experts identify the computer readable code or algorithms that are needed for the product. Some of these algorithms might be available as IP from third parties or from standard development committees. Some of them have to be developed as part of the product development. In this manner, the product specification 102 is further detailed in a computer readable code or algorithm 104 that can be expressed as a program such as C program or a math model such as a Matlab model, among others. The product specification 102 also contains requirements 106 such as cost, area, power, process type, library, and memory type, among others.

The computer readable code or algorithm 104 and requirement 106 are provided to an automated IC generator 110. Based only on the code or algorithm 104 and the constraints placed on the chip design, the IC generator 110 uses the process of FIG. 2 to automatically generate with no human involvement an output that includes a GDS file 112, firmware 114 to run the IC, a software development kit (SDK) 116, and/or a test suite 118. The GDS file 112 is used to fabricate a custom chip 120. The firmware 114 is then run on this fabricated chip to implement the customer product specification 102.

During physical synthesis, the IC generator 110 applies the encoded "side-band" information to netlist file. The system then applies design constraints (physical as well timing) in guiding the physical synthesis. In certain embodiments, such constraints are "implied" thru a netlist instance naming scheme.

The system of FIG. 1 alleviates the issues of chip design and makes it a simple process. The system shifts the focus of product development process back from the hardware implementation process back to product specification and algorithm design. Instead of being tied down to specific hardware choices, the algorithm can always be implemented on a digital chip processor that is optimized specifically for that application. The system generates this optimized processor automatically along with all the associated software tools and firmware applications. This whole process can be done in a matter of days instead of years that it takes now. In a nutshell the system makes the digital chip design portion of the product development in to a black box.

In one embodiment, the instant system product can take as input the following:
Computer readable code or algorithm defined in C/Matlab
Peripherals required
IO Specification
Area Target
Power Target
Margin Target (how much overhead to build in for future firmware updates and increases in complexity)
Process Choice
Standard Cell library Choice
Memory compiler Choice
Testability (scan, tap controller, bist etc)

The output of the system may be a Digital Hard macro along with all the associated firmware. A software development kit (SDK) optimized for this Digital Hard macro is also automatically generated so that future upgrades to firmware are implemented without having to change the processor.

Figure 2:
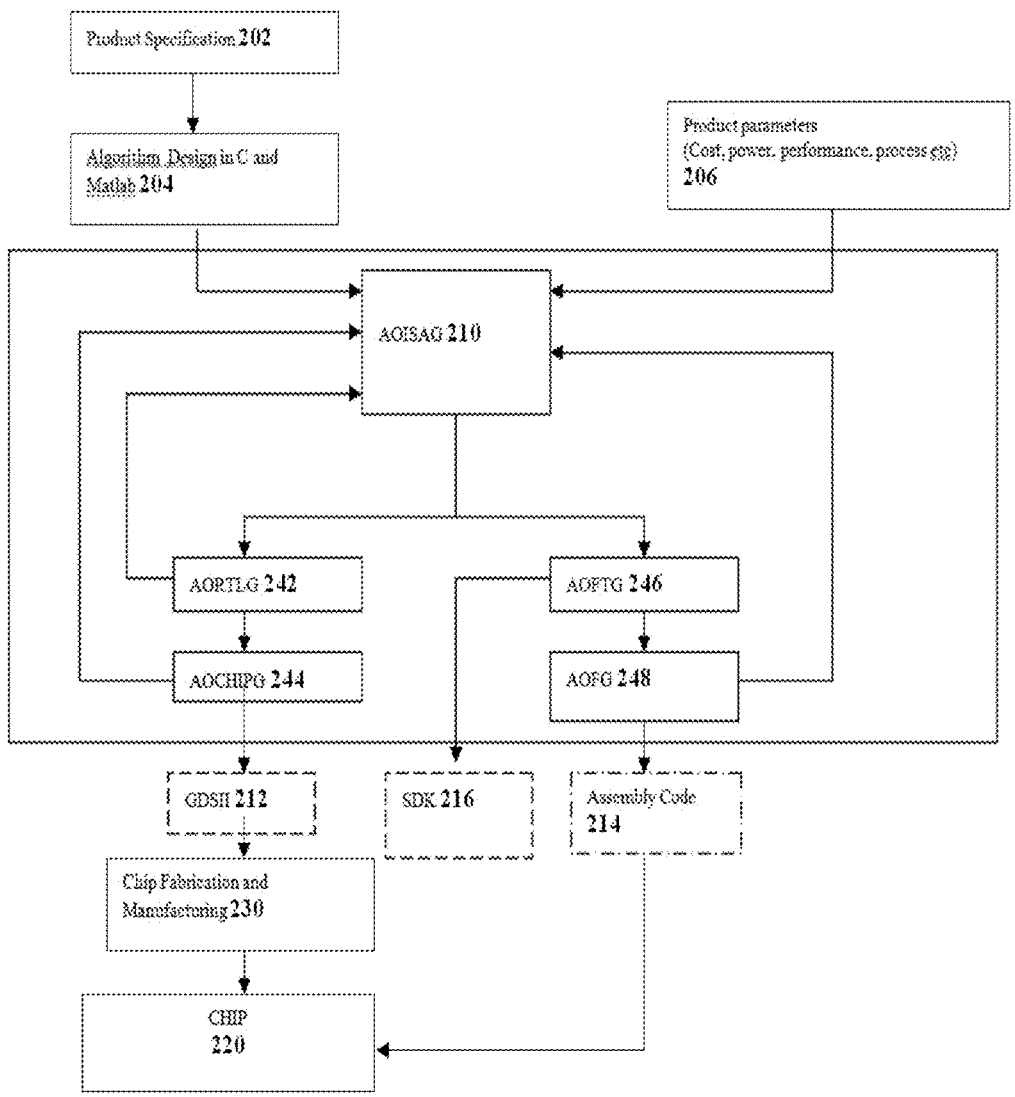
FIG. 2 shows an exemplary workflow to automatically generate a custom IC.

FIG. 2 shows an exemplary workflow to automatically generate a custom IC. This system performs automatic generation of the complete and optimal hardware solution for any chosen target application. While the common target applications are in the embedded applications space they are not necessarily restricted to that.

Referring to FIG. 2, an ASIC customer generates a product specification 202. The product specification 202 is further detailed in a computer readable code or algorithm 204 that can be expressed as a program such as C program or a math model such as a Matlab model, among others. The product specification 202 also contains product parameters and requirements 206 such as cost, area, power, process type, library, and memory type, among others. The computer readable code or algorithm 204 and product parameters 206 are provided to an automated IC generator 110 including an Automatic Optimal Instruction Set Architecture Generator (AOISAG) (210). The generator 210 controls an Automatic Optimal RTL Generator (AORTLG) 242, which drives an Automatic Optimal Chip Generator (AOCHIPG) 244. The AOCHIPG 244 encodes "side-band" information to netlist file and can capture design constraints (physical as well timing) that are productive in guiding the physical synthesis than original user constraints alone can. In certain embodiments, such constraints are "implied" thru a netlist naming scheme.

The output of AOCHIPG 244 and AORTLG 242 is provided in a feedback loop to the AOISAG 210. The AOISAG 210 also controls an Automatic Optimal Firmware Tools Generator (AOFTG) 246 whose output is provided to an Automatic Optimal Firmware Generator (AOFG) 248. The AOFG 248 output is also provided in a feedback loop to the AOISAG.

The IC generator 110 generates as output a GDS file 212, firmware 214 to run the IC, a software development kit (SDK) 216. The GDS file 212 and firmware 214 are provided to an IC fabricator 230 such as TSMC or UMC to fabricate a custom chip 220.

In one embodiment, the system is completely automated. No manual intervention or guidance is needed. The system is optimized. The tool will automatically generate the optimal solution. In other embodiments, the user can intervene to provide human guidance if needed.

The AOISAG 210 can automatically generate an optimal instruction set architecture (called ISA). The ISA is defined to be every single detail that is required to realize the programmable hardware solution and encompasses the entire digital chip specification. The details can include one or more of the following exemplary factors:

1) Instruction set functionality, encoding and compression
2) Co-processor/multi-processor architecture
3) Scalarity
4) Register file size and width. Access latency and ports
5) Fixed point sizes
6) Static and dynamic branch prediction
7) Control registers
8) Stack operations
9) Loops
10) Circular buffers
11) Data addressing
12) Pipeline depth and functionality
13) Circular buffers
14) Peripherals
15) Memory access/latency/width/ports
16) Scan/tap controller
17) Specialized accelerator modules
18) Clock specifications
19) Data Memory and Cache system
20) Data pre-fetch Mechanism
21) Program memory and cache system
22) Program pre-fetch mechanism The AORTLG 242 is the Automatic Optimal RTL Generator providing an automatic generation of the hardware solution in Register Transfer Language (RTL) from the optimal ISA. The AORTLG 242 is completely automated. No manual intervention or guidance is needed. The tool will automatically generate the optimal solution. The RTL generated is synthesizable and compilable.

The AOCHIPG 244 is the Automatic Optimal Chip Generator that provides automatic generation of the GDSII hardware solution from the optimal RTL. The tool 244 is completely automated. No manual intervention or guidance is needed. The tool will automatically generate the optimal solution. The chip generated is completely functional and can be manufactured using standard FABs without modification.

The AOFTG 246 is the Automatic Optimal Firmware Tools Generator for an automatic generation of software tools needed to develop firmware code on the hardware solution. It is completely automated. No manual intervention or guidance is needed. The tool will automatically generate the optimal solution. Standard tools such as compiler, assembler, linker, functional simulator, cycle accurate simulator can be automatically generated based on the digital chip specification. The AOFG 248 is the Automatic Optimal Firmware Generator, which performs the automatic generation of the firmware needed to be executed by the resulting chip 220. The tool is completely automated. No manual intervention or guidance is needed. Additionally, the tool will automatically generate the optimal solution. An optimized Real Time Operating System (RTOS) can also be automatically generated.

The chip specification defines the exact functional units that are needed to execute the customer application. It also defines exactly the inherent parallelism so that the number of these units that are used in parallel is determined. All the complexity of micro and macro level parallelism is extracted from the profiling information and hence the chip specification is designed with this knowledge. Hence the chip specification is designed optimally and not over designed or under-designed as such could be the case when a chip specification is designed without such profiling information. During the dynamic profiling the branch statistics are gathered and based on this information the branch prediction mechanism is optimally designed. Also all the dependency checks between successive instructions are known from the profiling and hence the pipeline and all instruction scheduling aspects of the chip specification are optimally designed.

The chip specification can provide options such as:

Hardware modulo addressing, allowing circular buffers to be implemented without having to constantly test for wrapping.

Memory architecture designed for streaming data, using DMA extensively and expecting code to be written to know about cache hierarchies and the associated delays.

Driving multiple arithmetic units may require memory architectures to support several accesses per instruction cycle Separate program and data memories (Harvard architecture), and sometimes concurrent access on multiple data busses Special SIMD (single instruction, multiple data) operations Some processors use VLIW techniques so each instruction drives multiple arithmetic units in parallel Special arithmetic operations, such as fast multiply-accumulates (MACs).

Bit-reversed addressing, a special addressing mode useful for calculating FFTs

Special loop controls, such as architectural support for executing a few instruction words in a very tight loop without overhead for instruction fetches or exit testing Special Pre-fetch instructions coupled with Data pre-fetch mechanism so that the execution units are never stalled for lack of data. So the memory bandwidth is designed optimally for the given execution units and the scheduling of instructions using such execution units.

Figure 3:
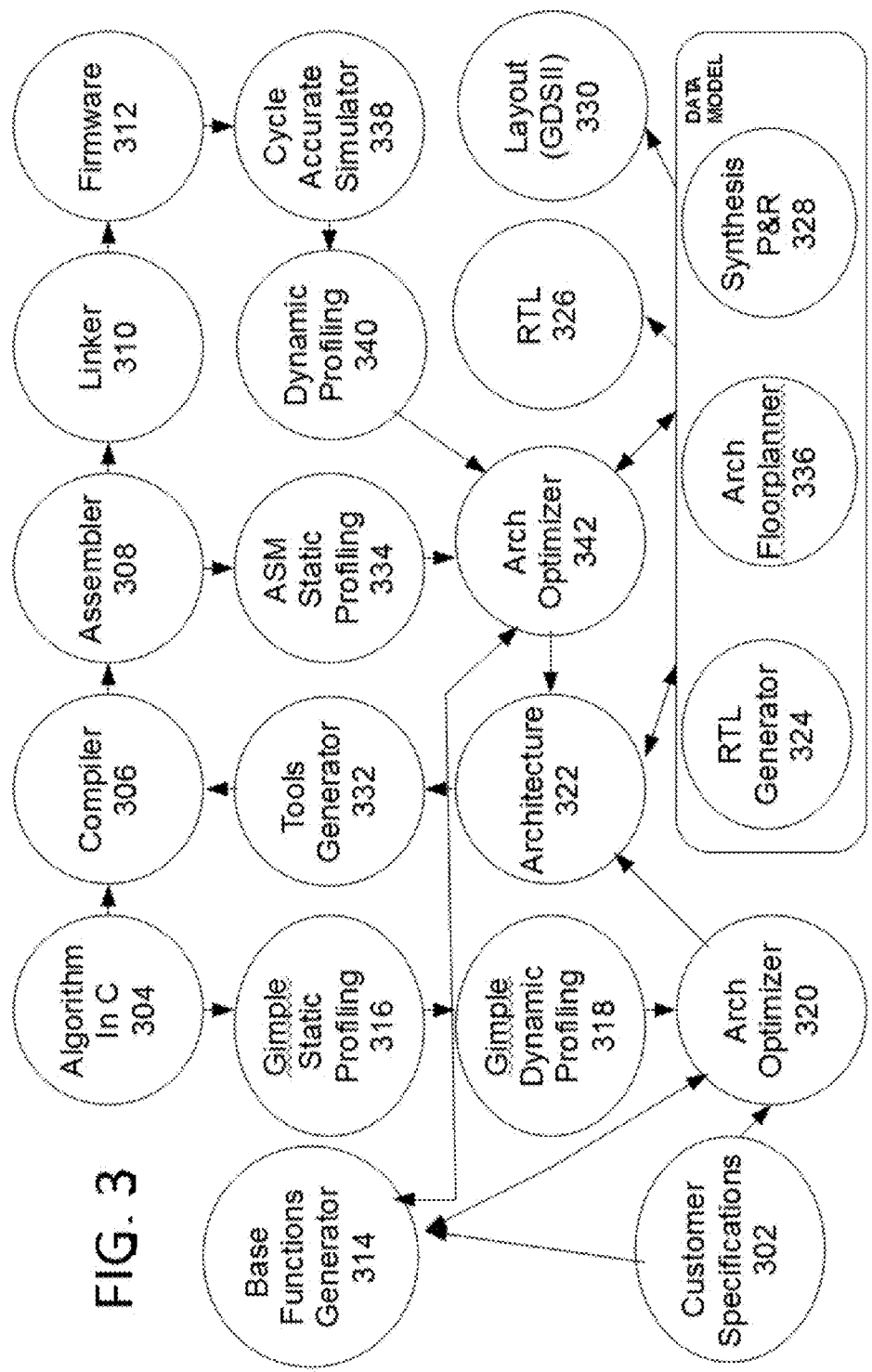
FIG. 3 shows an exemplary process to automatically generate a custom IC.

FIG. 3 shows an exemplary process flow for automatically generating the custom chip 120 of FIG. 1. Turning now to FIG. 3, a customer product specification is generated (302). The customer product specification 302 is further detailed in a computer readable code or algorithm 304 that can be expressed as a program such as C program or a math model such as a Matlab model, among others.

The customer algorithm 304 is profiled statically 316 and dynamically 318. The statistics gathered from this profiling is used in the architecture optimizer unit 320. This unit also receives the customer specification 302. The base functions generator 314 decides on the basic operations or execution units that will be needed to implement the customer algorithm 304. The base function generators 314 output is also fed to the architecture optimizer 320.

Based on the architecture optimizer 320 outputs and initial chip specification is defined as the architecture 322. This is then fed to the tools generator 332 unit to automatically generate the compiler 306, the Assembler 308, the linker 310, the cycle accurate simulator 338. Then using the tools chain the customer algorithm 304 is converted to firmware 312 that can run on the architecture 322.

The output of the assembler 308 is profiled statically 334 and the output of the cycle accurate simulator 338 is profiled dynamically 340. These profile information is then used by the architecture optimizer 342 to refine and improve the architecture 322.

The feedback loop from 322 to 332 to 306 to 308 to 310 to 312 to 338 to 340 to 342 to 322 and the feedback loop from 322 to 332 to 306 to 308 to 334 to 342 to 322 is executed repeatedly till the customer specifications are satisfied. These feedback loops happen automatically with no human intervention and hence the optimal solution is arrived at automatically.

The architecture optimizer 342 also is based on the architecture floor-planner 336 and synthesis and P&R 328 feedback. Architecture decisions are made in consultation with not only the application profiling information but also the physical place and route information. The architecture optimization is accurate and there are no surprises when the backend design of the designed architecture takes place. For example if the architecture optimizer chooses to use a multiplier unit that takes two 16 bit operands as input and generates a 32 bit result. The architecture optimizer 342 knows the exact timing delay between the application of the operands and the availability of the result from the floor-planner 336 and the synthesis 328. The architecture optimizer 342 also knows the exact area when this multiplier is placed and routed in the actual chip. So the architecture decision for using this multiplier is not only based on the need of this multiplier from the profiling data, but also based on the cost associated with this multiplier in terms of area, timing delay (also called performance) and power.

In another example, to speed up the performance if performance is a constraint on the custom chip, the compiler 306 takes a program, code or algorithm that takes long time to run on a serial processor, and given a new architecture containing multiple processing units that can operate concurrently the objective is to shorten the running time of the program by breaking it up into pieces that can be processed in parallel or in overlapped fashion in multiprocessing units. An additional task of front end is to look for parallelism and that of back end is to schedule it in such a manner that correct result and improved performance is obtained. The system determines what kind of pieces a program should be divided into and how these pieces may be rearranged. This involves granularity, level, and degree of parallelism
analysis of the dependencies among the candidates of parallel execution.

In another example, if space or power is a constraint on the custom chip, the compiler would generate a single low power processor/DSP that executes the code sequentially to save power and chip real estate requirement, for example.

From the architecture block 322, the process can generate RTL using an RTL generator (324). RTL code is generated (326) and the RTL code can be provided to a synthesis placement and routing block (328). Information from an architecture floor planner can also be considered (336). The layout can be generated (330). The layout can be GDSII file format, for example.

One aspect of the invention also is the unified architecture 322 representation that is created so that both the software tools generator 332 and the hardware RTL generator 324 can use this representation. This representation is called as SAMA (specification of architecture and micro-architecture).

The architecture design operation is based on analyzing the program, code or algorithm to be executed by the custom chip. In one implementation, given a program that takes long time to run on a uniscalar processor the system can improve performance by breaking the processing requirement into pieces that can be processed in parallel or in overlapped fashion in multiprocessing units. Additional task of front end is to look for parallelism and that of back end is to schedule it in such a manner that correct result and improved performance is obtained. The system can determine what kind of pieces a program should be divided into and how these pieces may be rearranged. This involves granularity, degree of parallelism, as well as an analysis of the dependencies among the candidates of parallel execution. Since program pieces and the multiple processing units come in a range of sizes, a fair number of combinations are possible, requiring different compiling approaches.

For these combinations the chip specification is done in such a way that the data bandwidth that is needed to support the compute units is correctly designed so that there is no over or under design. The Architecture Optimizer 342 first identifies potential parallel units in the program then performs dependency analysis on them to find those segments which are independent of each other and can be executed concurrently.

The architecture optimizer 342 identifies parallelism at granularity level of machine instruction. For example addition of two N-element vectors on an ordinary scalar processor will execute one instruction at a time. But on a vector processor all N instructions can be executed on N separate processor which reduces the total time to slightly more than N times that needed to execute a single addition. The architecture optimizer takes the sequential statements equivalent to the vector statement and performs a translation into vector machine instruction. The condition that allows vectorization is that the elements of the source operands must be independent of the result operands. For example, in the code:

```
        DO 100 J = 1,N
          DO 100 I = 1,N
            DO 100 K = 1,N
              C(I,J) = C(I,J) + A(I,K) * B(K,J)
100 CONTINUE
```

In this matrix multiplication example at each iteration C(I,J) is calculated using previous value of C(I,J) calculated in previous iteration so vectorization is not possible. If performance is desired, the system transforms the code into:

```
        DO 100 J = 1,N
          DO 100 K = 1,N
            DO 100 I = 1,N
              C(I,J) = C(I,J) + A(I,K) * B(K,J)
100 CONTINUE
```

In this case vectorization is possible because consecutive instructions calculate C(I-1,J) and COM which are independent of each other and can be executed concurrently on different processors. Thus dependency analysis at instruction level can help to recognize operand level dependencies and apply appropriate optimization to allow vectorization, among others.

Figure 4:
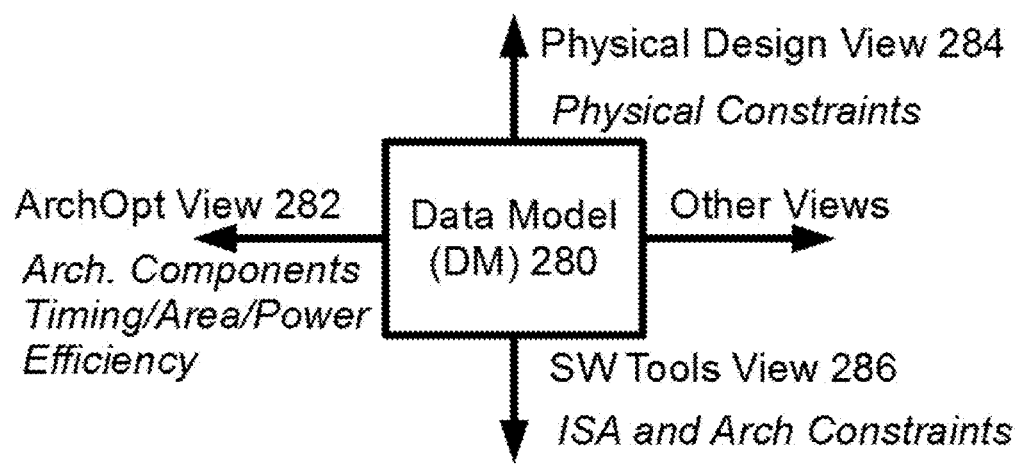
FIG. 4 shows an exemplary data model.
Figure 5:
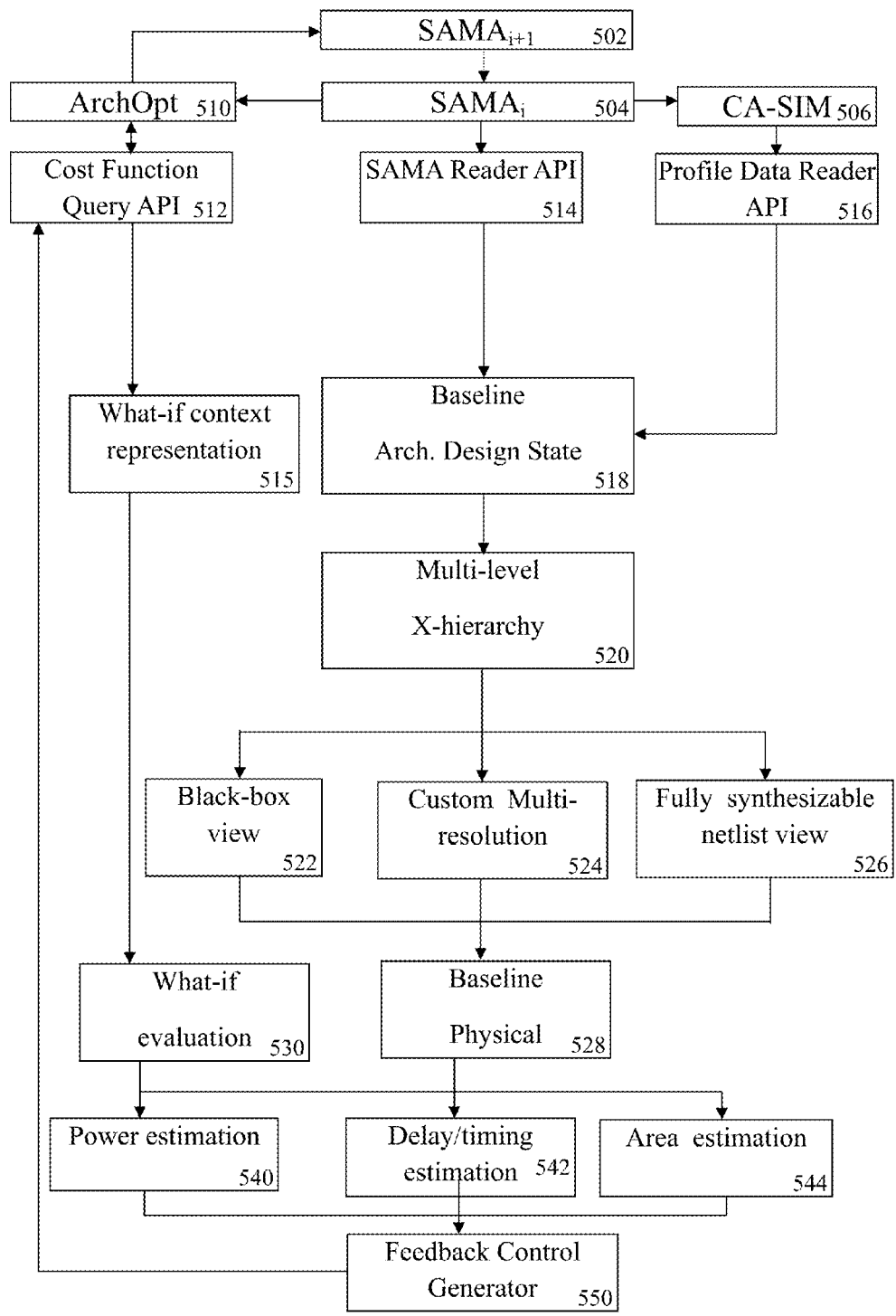
FIG. 5 shows an exemplary architecture-level What-if Incremental Cost Estimation Data Model (WICE-DM).

FIG. 4 shows an exemplary data model. The architecture optimizer 342 generates an intermediate hardware representation customized to the application code called System, Architecture, & Micro-Architecture (SAMA) representation 120 which is an Abstract Unified Representation of the ASIC. A data model (DM) 280 can express the SAMA in various views of the design. SAMA acts as a transition layer between software compilation and hardware synthesis. Such a transition layer is intended to take advantage of optimizations available in the compiler tool flow, and also to provide freedom to the low-level synthesizer, to explore options for application-specific implementations. The DM 280 can be used to generate various views of an application. For example, an architecture optimizer view 282 provides architectural component information such as timing, area, power efficiency so that the optimizer can best fit the design to the constraints. A physical design view 284 can be generated which addresses physical constraints such as space/size requirements. A software tools view 286 can leverage the DM 280 to provide ISA and architectural constraints for the software to use. Other views can be generated from the DM 280 as well. The DM 280 is a repository of information generated by tools of FIG. 3 and such information is needed to ultimately generate a layout of the IC. The DM 280 can generate different views that can be queried by different tools. These views can be used during physical design FIG. 5 shows an exemplary process for performing physical synthesis using the data model of FIG. 4. The process encodes an initial architecture level knowledge in the data model to pass information for physical synthesis of a chip specification uniquely customized to the computer readable code (510). Next, the process iteratively performs physical synthesis of the chip specification and updates the data model of the chip specification in each iteration until the constraints are satisfied (520). Information generated from a prior iteration is provided as feedback loops with critical path look-ahead information supplied to the next iteration through the data model (530). For example, the system can apply pre and post fix tags to indicate if the grouping of cells in a hierarchy is a hard or soft constraint. The system can indicate placement constraints for optimal timing with one of: macro blocks name, hierarchy name, pragma, comment, dummy module, wrapper module.

Names can be stored with certain pre/post fix to indicate a critical path from the architecture level knowledge. Thus, in one example, if during a prior pass, a sub module A needs to be placed near sub module B and C, the relationship can be denoted $A_{BC}$ and similarly B can be denoted $B_{AC}$.

At the final iteration where all constraints are met, the process synthesizes a computer readable description of the chip specification into the custom integrated circuit for semiconductor fabrication.

FIG. 5 shows an exemplary architecture-level What-if Incremental Cost Estimation Data Model (WICE-DM). The WICE-DM architecture consists of front-end, back-end, context management and API sections. The front-end represents fully elaborated architecture design state in A2C design methodology. The elaborated design is stored in a cross-referenced 'multi-aspect multi-level' (MAML) hypergraph configuration that allows very efficient customizable design abstraction model (DAM) generation. The back-end represents physical design aware what-if incremental cost estimation engine. The context management section determines the appropriate DAM that front-end must generate to drive the analysis in the back-end.

Exemplary MAML hypergraph configurations are discussed next. A hyper-graph is a well-known graph structure that provides interconnections to be modeled as hyper-edges (i.e multiple heads and multiple tails) as opposed to single pair of nodes. The multi-level hierarchy in a hyper-graph can be used in netlist partitioning during placement as well as in design verification problems. This circuit diagram can be interpreted as a drawing of a hypergraph in which four vertices (depicted as white rectangles and disks) are connected by three hyperedges drawn as trees. For example, a circuit diagram can be interpreted as a drawing of a hypergraph in which a plurality of vertices (depicted as white rectangles and disks representing components) are connected by hyperedges drawn as trees.

The hyper-graph can support multiple hierarchy aspects that support overlapping hierarchies. This enables the hyper-graph to allow an efficient switch between aspects.

FIG. 5 shows the data flow for the physical design (PD) model based area, power and delay cost estimation for architecture and micro-architecture level incremental what-if analysis. Turning now to FIG. 5, after iteration i, the next SAMA i+1 is used as the input to the next iteration in 502. Thus, SAMA at time i is updated in 504. The SAMA in 504 is provided to CA simulator in 506 and the architecture optimizer 510. The AO 510 communicates through a cost function query API 512. The SAMA communicates through a SAMA reader API 514. The CAsim sends profile information through a profile data reader API 516.

The SAMA reader API 514 communicates architecture and synthesis information to an architecture design state (MAML-HG) 518. The cost function query API 512 provides information to an evaluation context management 515, which in turn provides information to the MAML-HG 518. The context management 515 can be used to form an evaluation context physical design model. The context management 515 keeps track of proposed design modifications from baseline. Many changes are proposed without commit during initial stages of cost evaluation. Committed context becomes part of baseline design (SAMA file update).

The MAML-HG 518 provides a multi-level hypergraph data structure to a multi-level X-hierarchy manager 520. The manager 520 in turn provides various views including a black-box view 522, a custom multi-resolution hierarchical view 524, and a fully synthesizable netlist view 526, among others. The views 522-526 can be used to form a baseline physical design model 528.

The models 528-530 can be used to by a power hot-spots estimation engine 540, a delay and timing estimation engine 542, and an area estimation engine 544, among others. The power hot-spot estimation engine 540 can receive estimated activity factors (AFs) from the MAML-HG 518. Data from engines 540-544 are provided to an analytical information manager 550, which provides feedback to the AO 510 via the cost function query API 512.

One exemplary API is discussed in more details below.
Cost Function Estimation (CFE) API.
boolean define_contextcontext_name {change_list}
boolean set_active_context context_name
response_type compute_delay {path|whole_chip}
response_type compute_area component
boolean commit_context context_name—outfileName sama_i.txt The 'response_type' includes following information
  relative cost (delay, area, power etc depending on the actual query)
    qualitative (improve, no significant impact, degrade)
    quantitative (a heuristic measure of the qualitative change)
  Conditional cost with supplementary physical design optimization (SPDO)
    supplementary PD optimization ID (internal book-keeping ID for future reference)
    new relative cost if WA is accepted.
  Confidence interval
    A value between 0 and 1
    1 means cost was computed with most accurate data driven tool flow
    0 means cost was estimated roughly and is very likely to be significantly different if a detailed cost analysis is performed.

The ability to provide a supplementary optimization proposal (indexed by an ID) elevates physical design optimization to influence the AO when architecture optimizations are still being considered and not finalized. In standard industry flows, physical design optimizations are not done until architecture optimization has been completed. At the same time, AO need not be aware of the details of the work-around. This mechanism enables AO to consider far-reaching consequences of an optimization move and not just the immediately computed cost function and thus enable better design convergence.

Another exemplary API is the path activity profile as follows:
Path Profile (PP) API
set_path_likelihood path activity_factor Path activity factor is a probability or likelihood that the path gets exercised. This information is available from a cycle-accurate-simulator. WICE-DM integrates this information with the path topology information obtained from physical design modeling. As a result, it generates a power utilization estimate for each unit area of the physical design. This then provides the power hot-spot information which can then be provided as a feedback to instruction scheduler in the form of a resource constraint. The net effect of this feedback is that (a) instructions are scheduled such that potential timing and other signal integrity issues are avoided and (b) components that need to be power hot-spot neighborhoods can be retrofitted with power islanding, clock gating or other techniques and the area/timing cost of such improvisations will be available immediately.

In one embodiment of FIG. 5, architecture level knowledge is encoded into a netlist file in to pass information that is not normally available to physical synthesis. For example, hierarchy names may contain pre and post fix tags to indicate if the grouping of cells in that hierarchy is a hard or soft constraint. This information is useful for making more aggressive decisions in physical partitioning that result in improving tool chain capacity resulting in faster turn-around time. The names of instances may also contain certain pre/post fix to indicate if architecture level model sees this as a likely pathway for real critical path. Physical synthesis can "look-ahead" to real critical paths rather than chipping away at wrong ones until right one is discovered. This eliminates unwanted optimization (over-optimization leading to other cost increase) and save turn-around time. As another example, certain macro blocks may be named to indicate placement constraints (such as array placement, among others) that helps achieve optimal timing first time around. In addition to encoding "side-band" information to the netlist file, the flow of FIG. 3 is also able to generate design constraints (physical as well timing) that are more productive in guiding the physical synthesis than original user constraints alone can. In some cases such constraints are "implied" thru a netlist naming scheme.

Figure 6:
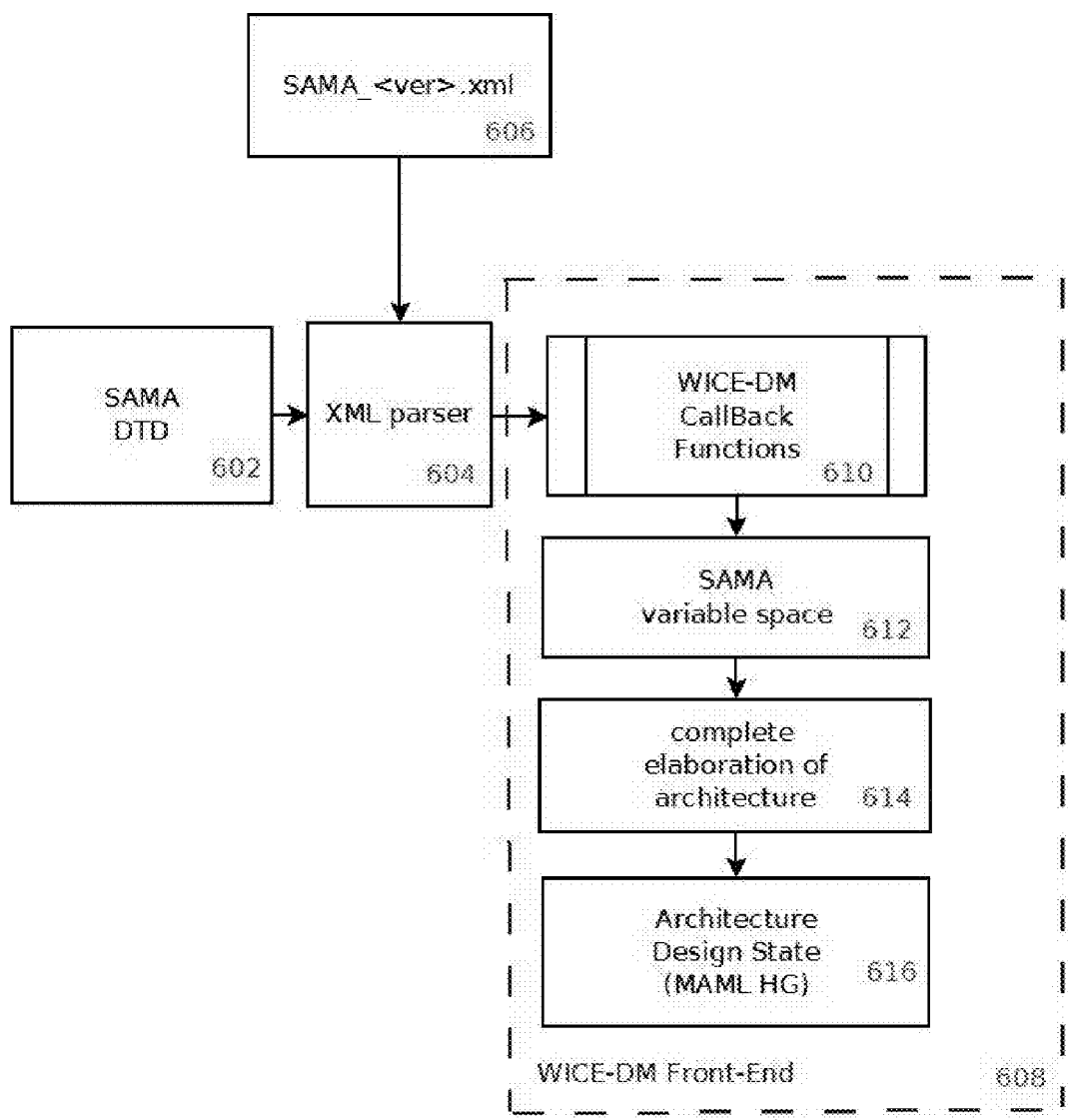
FIG. 6 shows an exemplary process to initialize a front end of the design, in this case the front end of WICE-DM.

FIG. 6 shows an exemplary process to initialize the front end of the design. The front-end represents the "architecture design state". The front end obtains a high level description of the architecture specification from a SAMA file and generates a complete elaboration of all the functional components needed for the realization of the specified architecture.

FIG. 6 is the process for initializing the WICE-DM Front-End. The process uses XML mark up language to support machine understanding of data. In this process, the SAMA DTD is received in 602 and sent to an XML parser 604, which also receives the SAMA version information in 606. The XML parser 604 sets up the WICE-DM call back functions in 610, the SAMA variable space in 612. The process also elaborates the architecture in 614 and generates the architecture design state MAML-HG in 616. Once initialized, the elaborated architecture serves as the baseline for all cost function queries.

Figure 7:
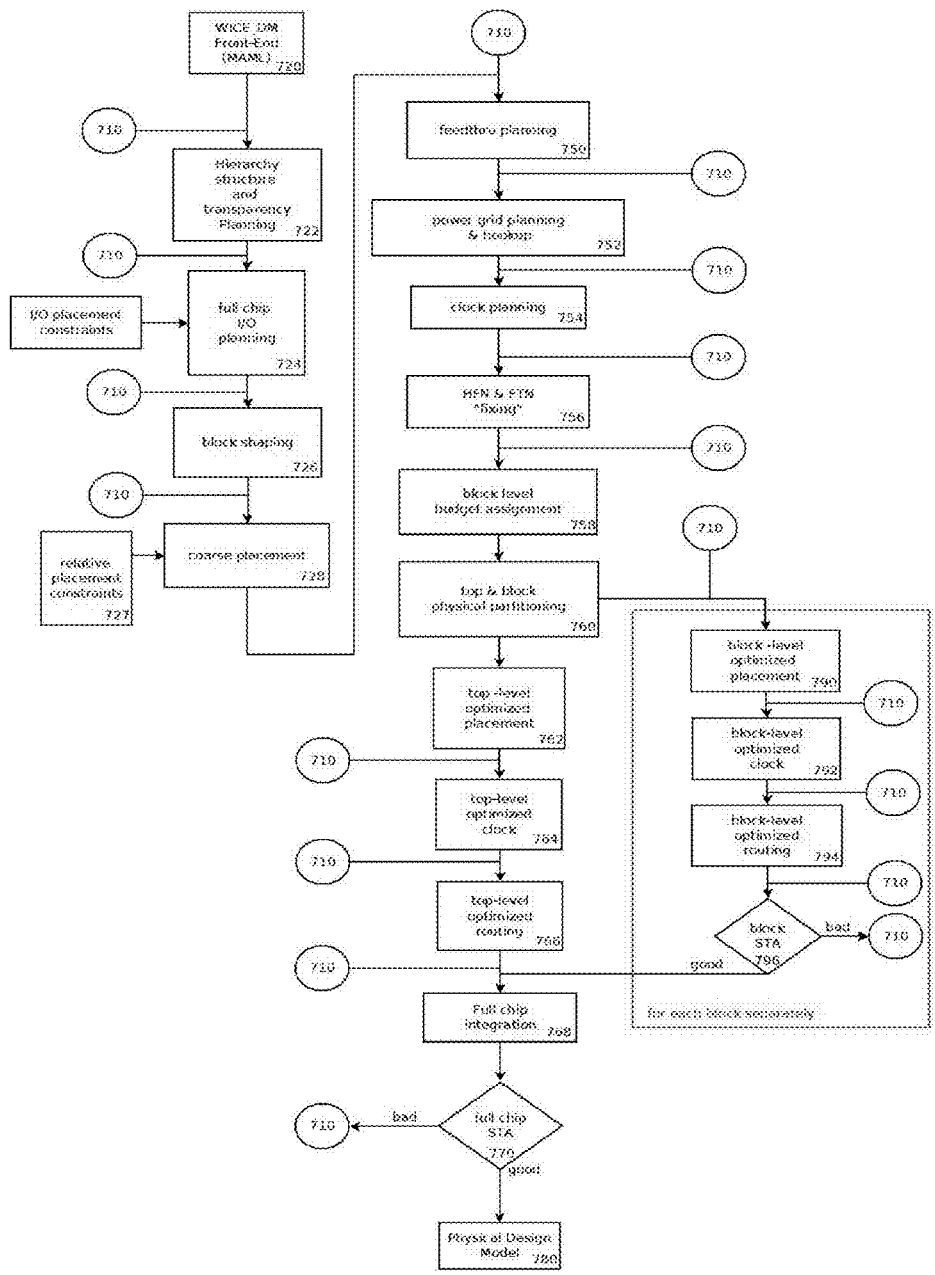
FIG. 7 shows an exemplary physical synthesis process with optimization loop backs.

FIG. 7 shows an exemplary physical synthesis process with optimization loop backs 710. The plurality of loop backs 710 allow the process to have fine grain optimization of specific operations that could be focused on for improvements. From the frond end in 720, the process performs hierarchy structure and transparency planning (722). Next, after receiving I/O placement constraints in 723, full chip I/O planning is done (724). Block shaping can be done in 726. Next, relative placement constraints can be received (727), and a coarse placement can be done in 728.

Feedthrough planning can be done in 750. The process continues with power grid planning and hook up in 752. Clock placement planning is done in 754. HFN (High Fanout Net) and FTN (FeedThrough Net) fixing operations can be done in 756. Then a block level budget assignment can be in in 758. Top and block level physical partitioning is done 760. Top level optimized placement can be determined in 762. Top level optimized clock can be determined in 764. Top level optimized routing can be determined in 766.

From the top and block physical partitioning, the process can perform module 788 for each block of the chip. In module 788, a block level optimized placement can be determined in 790. Block level optimized clock can be determined in 792. Block level optimized routing can be determined in 794. Further, block STA can be done in 796.

From 766 or 796, the process performs full chip integration in 768 and full chip STA in 770. If the result of the full chip STA is successful, the process generates a physical design model in 780 and otherwise it loops back to any of 710 to optimize and fit the design to the constraints.

In one embodiment, the following exemplary pseudo-code of a physical synthesis process with critical path look-ahead is as follows:

```
Start → Gate level netlist
    1. Design partitioning
    2. coarse placement
    3. partition sizing and shaping
    4. top level I/O pad placement
    5. logic placement
    6. HFN buffering
    7. block I/O assignment (including feed thrus) → block floor-plan ready
    8. buffering optimization
    9. estimated STA ← must meet goals, otherwise very likely design will
       not converge.
    10. block level budget creation → block SDC ready
    11. {blocks}
        1. start → block floor-plan with block I/O fixed
        2. perform detailed placement optimization
        3. perform detailed clock tree synthesis and optimization
        4. perform detailed routing optimization
        5. block level STA ← must meet local goals to fix current timing
           issues.
    12. top level assembly
        1. start → detailed placement optimization of top level netlist
        2. detailed clock optimization of top level netlist
        3. detailed route optimization of top level netlist
    13. detailed parasitic extraction
    14. full chip STA ← must meet goals to go to tape-out
    15. chip finishing tasks — metal fill etc.
end → GDSII layout
```

A gate level netlist is the input to the process. The process has two loops. In loop 1, steps 1 thru 9 are usually iterated many times to reach a target goal for step 9. In loop 2, steps 11.1 thru 11.5 are also repeated many times for each block and may require re-doing loop 1 if budgets in step 10 are discovered to be non-converging. Step 14 could fail because estimated STA in step 9 was inconsistent with additional realities.

Figure 8A:
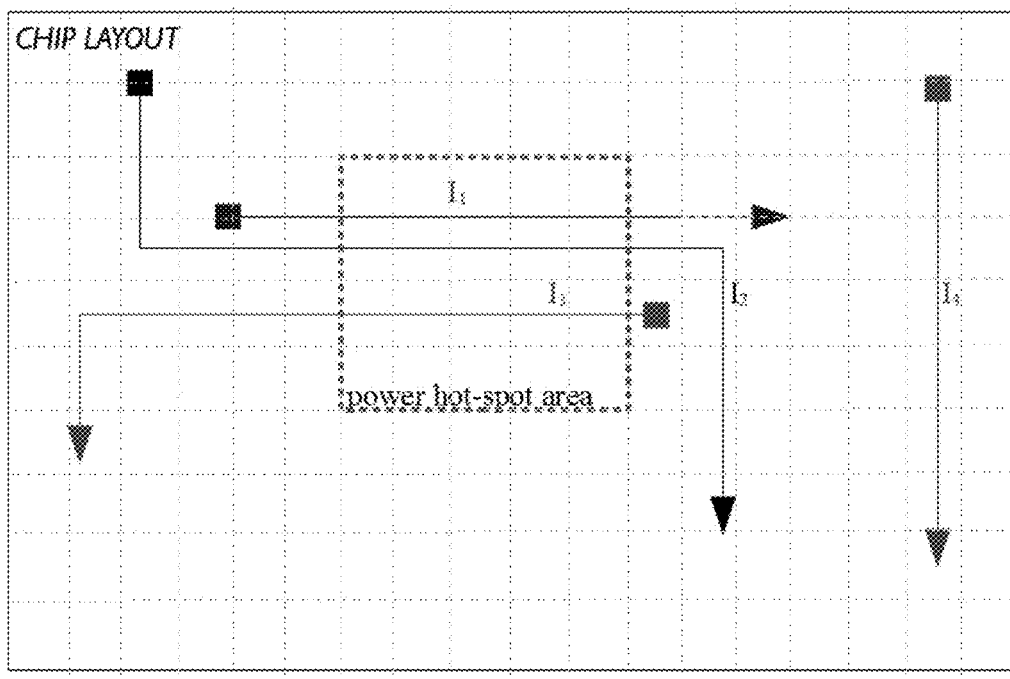
FIG. 8A shows an exemplary diagram illustrating correlations between instruction issue and path exercise based on instruction execution profile.

FIG. 8A shows an exemplary diagram illustrating correlations between instruction issue and path exercise based on instruction execution profile. The cycle-accurate-simulator provides path activity factor which is a probability or likelihood that the path gets exercised. WICE-DM integrates this information with the path topology information obtained from physical design modeling. As a result, it generates a power utilization estimate for each unit area of the physical design. This then provides the power hot-spot information which can then be provided as a feedback to instruction scheduler in the form of a resource constraint. The net effect of this feedback is that (a) instructions are scheduled such that potential timing and other signal integrity issues are avoided and (b) components that need to be power hot-spot neighborhoods can be retrofitted with power islanding, clock gating or other techniques and the area/timing cost of such improvisations will be available immediately.

In traditional flows, at physical design stage the only information about path exercise likelihood that is available is user designated false-paths (the ones that have 0 probability). In WICE-DM this concept is extended to represent a range of probability values from 0 to 1. The mechanism enables WICE-DM to influence the behavior of the architecture optimizer. Thus the AO is led to search in newer paths that were potentially left behind previously resulting in converging on a different solution as optimal. FIG. 8A shows an example where an instruction execution pathway (topology) is shown for 4 exemplary instructions, $I_1$ thru $I_4$. In this example, the instruction scheduler prefers to sequence their execution in the order: $I_1 \rightarrow I_2 \rightarrow I_3 \rightarrow I_4$. Based on power hot-spot estimated cost, WICE-DM will insert a new resource constraint to influence the instruction scheduler. So the new optimal execution order could be: $I_1 \rightarrow I_3 \rightarrow I_4 \rightarrow I_2$. The reordering of execution order allows time for the power hot-spot area to cool down before it is operated again.

Figure 8B:
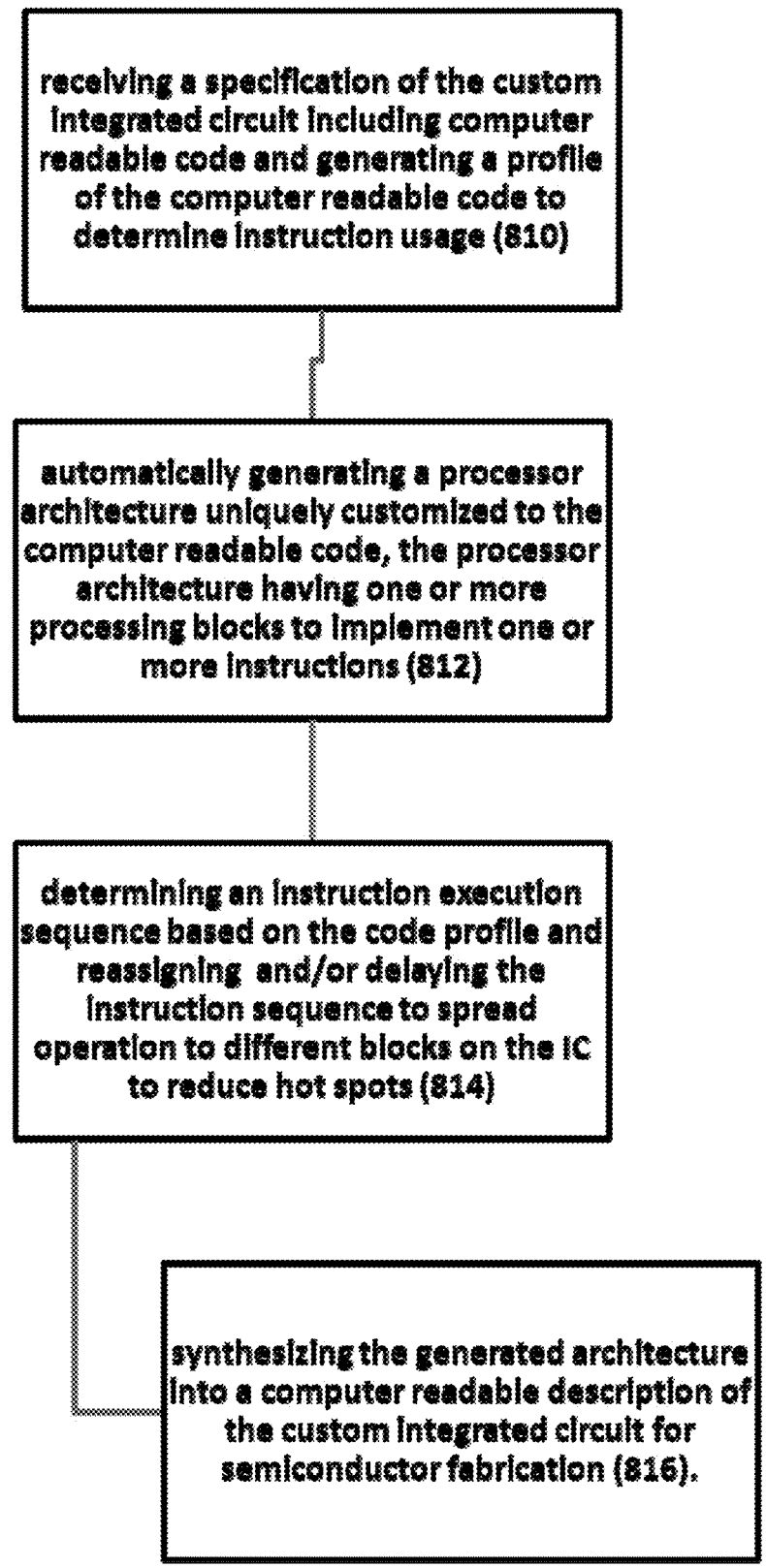
FIG. 8B shows an exemplary diagram illustrating how a instruction scheduler can minimize power hot spots based on instruction execution profile.

FIG. 8B shows an exemplary diagram illustrating how an instruction scheduler can minimize power hot spots based on instruction execution profile. The process includes receiving a specification of the custom integrated circuit including computer readable code and generating a profile of the computer readable code to determine instruction usage (810); automatically generating a processor architecture uniquely customized to the computer readable code, the processor architecture having one or more processing blocks to implement one or more instructions (812); determining an instruction execution sequence based on the code profile and reassigning the instruction sequence to spread operation to different blocks on the IC to reduce hot spots (814). In lieu of changing the instruction sequence, parts of the instruction sequence can also be temporally delayed to average out the hot spots, among other options. Finally, the process synthesizes the generated architecture into a computer readable description of the custom integrated circuit for semiconductor fabrication (816).

Figure 8C:
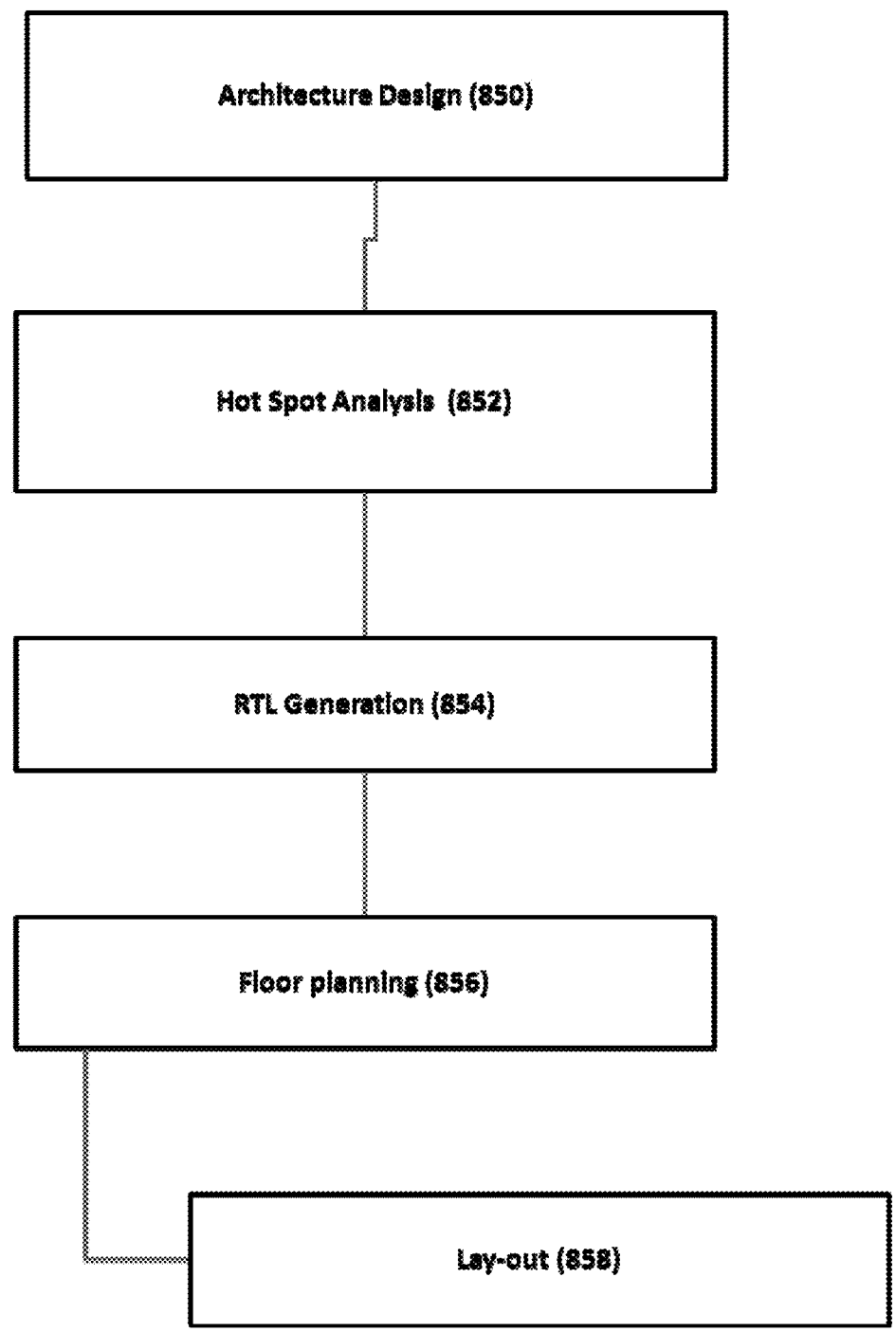
FIG. 8C shows an exemplary work flow process in accordance with one aspect of the present invention.

FIG. 8C shows an exemplary work flow process in accordance with one aspect of the present invention. In the flow of FIG. 8C, the system generates an Architecture Design (850). Next, a Hot Spot Analysis is done (852). Then an intermediate code such as RTL can be generated (854). Floor planning is performed (856), and lay-out can be done (858). The information generated during hot spot analysis is incorporated early on.

Figure 9A:
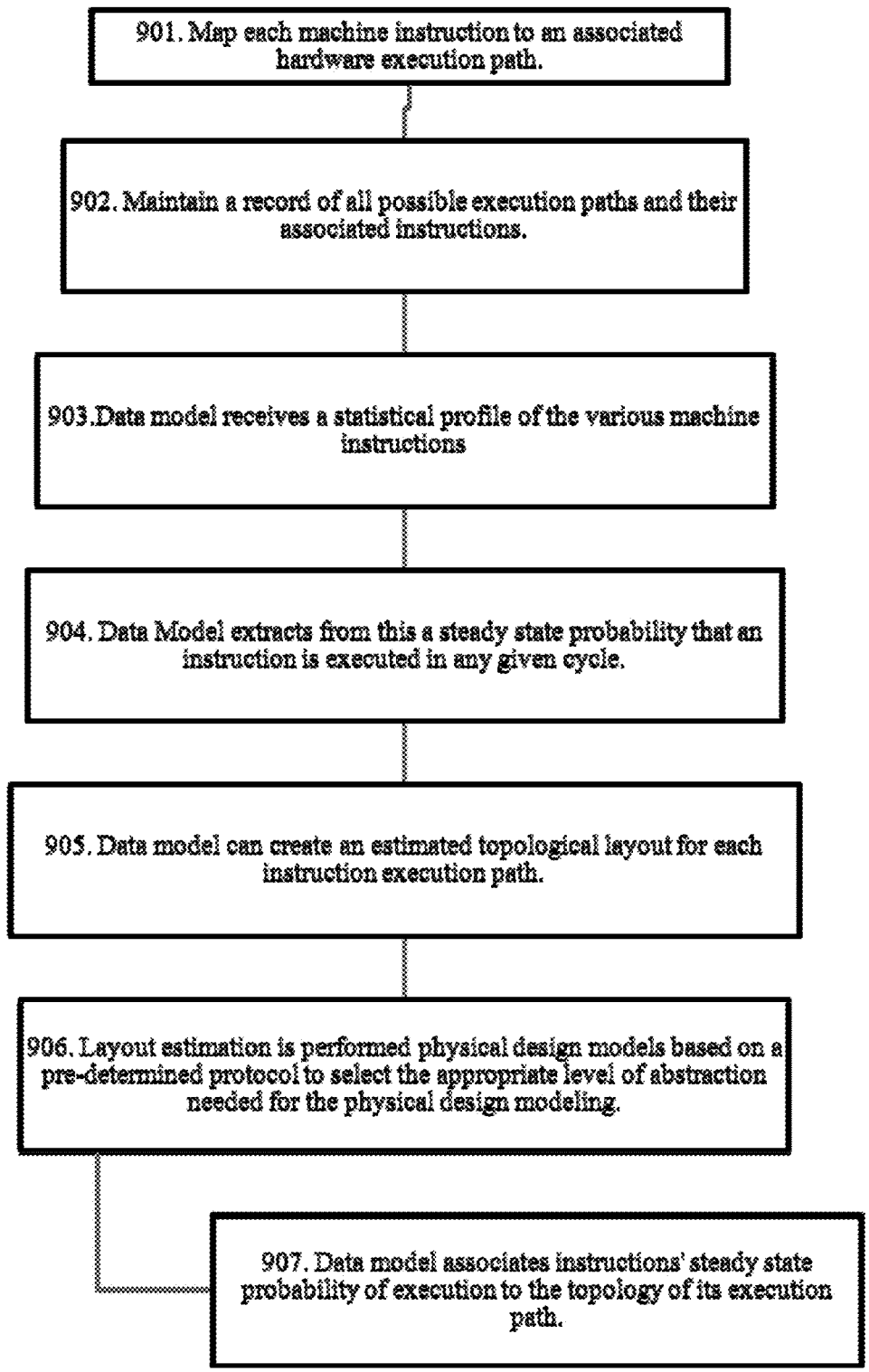
FIGS. 9A-9B show an exemplary task level process describing how hot-spot aware instruction scheduler optimization can be achieved by the data model.
Figure 9B:
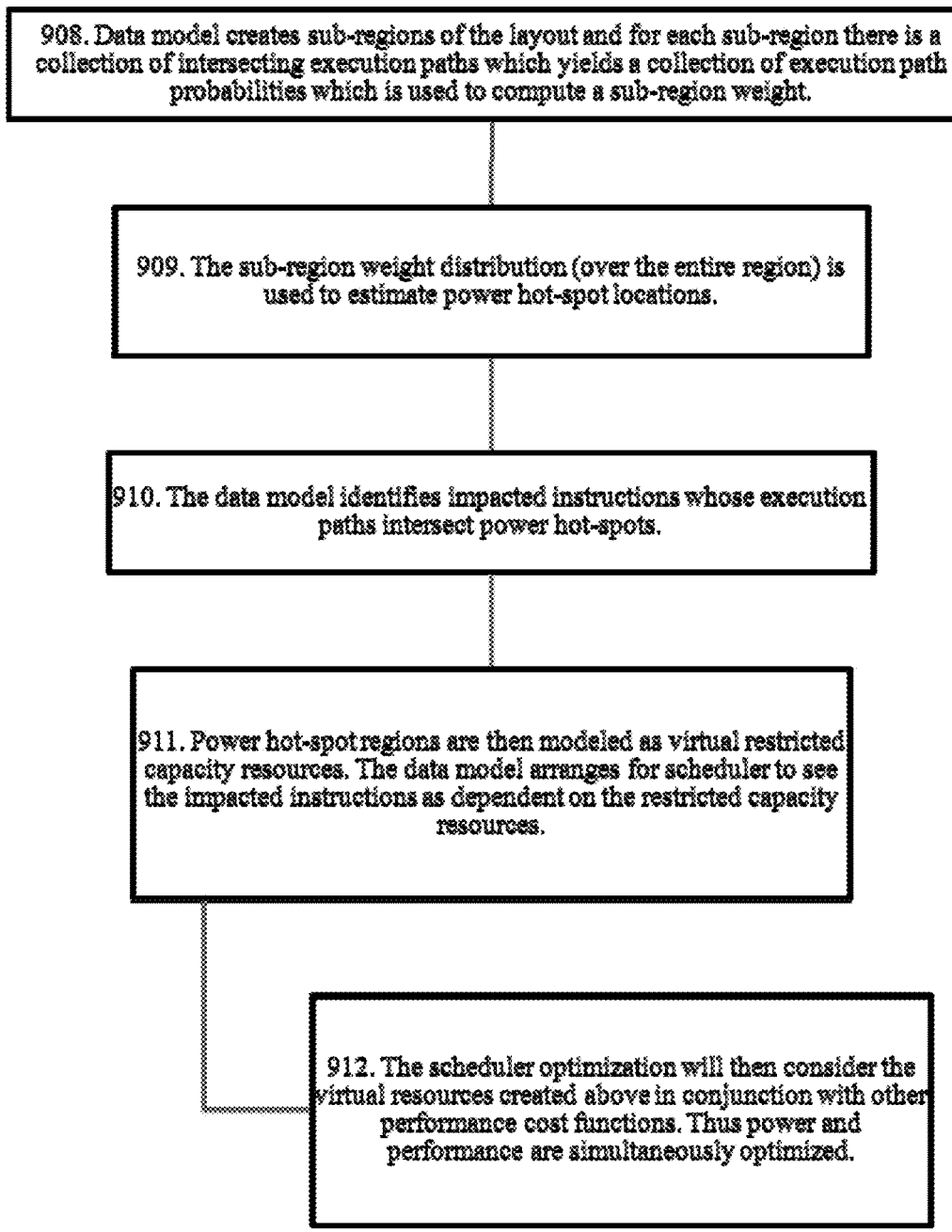

FIGS. 9A-9B show an exemplary task level process describing how hot-spot aware instruction scheduler optimization can be achieved by the data model. In 901, the process maps each machine instruction to an associated hardware execution path. In 902, the process maintains a record of all possible execution paths and their associated instructions in the data model. Next, in 903, the data model receives a statistical profile of the various machine instructions. In 904, the data model extracts from this a steady state probability that an instruction is executed in any given cycle. In 905, the data model can create an estimated topological layout for each instruction execution path. In 906, layout estimation is performed using a variety of physical design models based on a pre-determined protocol to select the appropriate level of abstraction needed for the physical design modeling. In 907, the data model associates instructions' steady state probability of execution to the topology of its execution path.

In 908, the data model creates sub-regions of the layout and for each sub-region there is a collection of intersecting execution paths which yields a collection of execution path probabilities which is used to compute a sub-region weight.

In 909, the sub-region weight distribution (over the entire region) is used to estimate power hot-spot locations. In 910, the data model identifies impacted instructions whose execution paths intersect power hot-spots. In 911, power hot-spot regions are then modeled as virtual restricted capacity resources. The data model arranges for instruction scheduler to see the impacted instructions as dependent on the restricted capacity resources. Restricted capacity translates to limiting the number of execution paths in a sub-region that should be allowed to activate in close succession. Such a resource dependency can be readily added to resource allocation tables of an instruction scheduler. In 912, the instruction scheduler optimization will then consider the virtual resources created above in conjunction with other performance cost functions. Thus power and performance are simultaneously optimized.

Although the above processes reorders execution sequence, alternatively, instead of reordering the execution sequence to spatially spread the operation on the IC, the process can determine instruction execution sequence based on the code profile and spatially assigning the processing blocks to spread operation to different areas on the IC to reduce hot spots.

In one embodiment, a fast incremental physical delay estimation model for micro-architecture optimization loop can be generated as follows. First, the process identifies a predetermined partitioning scheme and converts RTL into coarse gate level netlist (from ADM). The major components are black-boxed, and the interfaces are abstracted into fewer nets. The process determines simple pre-determined route shapes—which are easy for fast timing calculation. A timing graph is specifically designed for sensitivity analysis. The timer uses an Elmore delay estimation and provides best, average and worst case "flight" time between every major block (modeled as black-box). The model allows incremental queries and is several orders of magnitude faster than STA tools. The speed is used to provide incremental cost feedback—not tape-out quality of result (QoR) measurement.

In one exemplary design, an algorithm requires 500M MAC operations/cycle. With the process of FIG. 5, an Initial Architecture is generated with an estimated clock speed of about 250 MHz on 180 nm TSMC process node. The initial hardware is designed for 2 MAC units to achieve required throughput. However, after gate level synthesis, the achievable clock frequency is reduced to 200 MHz and the information is updated in the DM 280. After back-end flow (step 14 above), the achievable clock frequency further reduced to <165 MHz and the DM 280 is updated with the information. Since program pieces and the multiple processing units come in a range of sizes, a fair number of combinations are possible, requiring different optimizing approaches. The architecture optimizer first identifies potential parallel units in the program then performs dependency analysis on them to find those segments which are independent of each other and can be executed concurrently. The system revisits the architecture decision and now the hardware is re-designed for 3 MAC units. The new design iteratively loops through the backend flow again to see design goals are met.

The system alleviates the problems of chip design and makes it a simple process. The embodiments shift the focus of product development process back from the hardware implementation process back to product specification and computer readable code or algorithm design. Instead of being tied down to specific hardware choices, the computer readable code or algorithm can always be implemented on a processor that is optimized specifically for that application. The preferred embodiment generates an optimized processor automatically along with all the associated software tools and firmware applications. This process can be done in a matter of days instead of years as is conventional. The system is a complete shift in paradigm in the way hardware chip solutions are designed. Of the many benefits, the three benefits of using the preferred embodiment of the system include 1) Schedule: If chip design cycles become measured in weeks instead of years, the user can penetrate rapidly changing markets by bringing products quickly to the market; and
2) Cost: The numerous engineers that are usually needed to be employed to implement chips are made redundant. This brings about tremendous cost savings to the companies using system.
3) Optimality: The chips designed using The instant system product have superior performance, Area and Power consumption.

By way of example, a computer to support the automated chip design system is discussed next. The computer preferably includes a processor, random access memory (RAM), a program memory (preferably a writable read-only memory (ROM) such as a flash ROM) and an input/output (I/O) controller coupled by a CPU bus. The computer may optionally include a hard drive controller which is coupled to a hard disk and CPU bus. Hard disk may be used for storing application programs, such as the present invention, and data. Alternatively, application programs may be stored in RAM or ROM. I/O controller is coupled by means of an I/O bus to an I/O interface. I/O interface receives and transmits data in analog or digital form over communication links such as a serial link, local area network, wireless link, and parallel link. Optionally, a display, a keyboard and a pointing device (mouse) may also be connected to I/O bus. Alternatively, separate connections (separate buses) may be used for I/O interface, display, keyboard and pointing device. Programmable processing system may be preprogrammed or it may be programmed (and reprogrammed) by downloading a program from another source (e.g., a floppy disk, CD-ROM, or another computer).

Each computer program is tangibly stored in a machine-readable storage media or device (e.g., program memory or magnetic disk) readable by a general or special purpose programmable computer, for configuring and controlling operation of a computer when the storage media or device is read by the computer to perform the procedures described herein. The inventive system may also be considered to be embodied in a computer-readable storage medium, configured with a computer program, where the storage medium so configured causes a computer to operate in a specific and predefined manner to perform the functions described herein.

The invention has been described herein in considerable detail in order to comply with the patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. A method to manage power in a custom integrated circuit (IC) design, comprising:
    automatically generating an application specific instruction set processor architecture uniquely customized to the computer readable code with a compiler-in-the-loop to compile, assemble and link code for each processor architecture iteration, the processor architecture having one or more processing blocks on the IC executing one or more instructions
    wherein the instruction contain instruction scheduler to made aware of power usage through the data model and see the true cost of scheduling instruction execution to get high performance with minimal hot spots on the chip;
    wherein the instruction scheduler is power aware in that the instruction scheduler use predicted hot spot information and map this information to virtual resource constraints so that standard off-the-shelf instruction scheduler can become power aware;
    wherein a data model associates an instruction's steady state probability of execution to a topology of an execution path;
    creating from a data model sub-regions of a layout and for each sub-region determining a collection of intersecting execution paths yielding one or more execution path probabilities to determine a sub-region weight with a sub-region weight distribution to estimate power hot-spot locations
    determining an instruction execution sequence based on the code profile and reassigning or delaying the instruction sequence to spread operations or activities over the processing blocks to reduce hot spots; and
    synthesizing the generated architecture into a computer readable description of the custom integrated circuit for semiconductor fabrication.

2. The method of claim 1, wherein each machine instruction is associated with a hardware execution path, comprising maintaining in a data model a record of possible execution paths and associated instructions.

3. The method of claim 1, further comprising receiving a data model with a statistical profile of the machine instructions and extracts a steady state probability of an instruction execution in any given cycle.

4. The method of claim 3, wherein the data model creates an estimated topological layout for each instruction execution path.

5. The method of claim 4, further comprising estimating a layout using one or more physical design models based on a pre-determined protocol and selecting a predetermined level of abstraction needed for physical design modeling.

6. The method of claim 3, wherein the data model associates an instruction's steady state probability of execution to a topology of an execution path.

7. The method of claim 6, further comprising creating from the data model sub-regions of a layout and for each sub-region determining a collection of intersecting execution paths yielding one or more execution path probabilities to determine a sub-region weight.

8. The method of claim 7, further comprising applying sub-region weight distributions to estimate power hot-spot locations.

9. The method of claim 1, further comprising applying a data model to identify impacted instructions whose execution paths intersect power hot-spots.

10. The method of claim 9, further comprising modeling power hot-spot regions as virtual restricted capacity resources.

11. The method of claim 9, further comprising provided through the data model impacted instructions as dependent on the restricted capacity resources to an instruction scheduler of the compiler.

12. The method of claim 11, wherein an instruction scheduler optimization considers the restricted capacity resources in conjunction with one or more performance cost functions to simultaneously optimize power/hot-spots and performance for the IC.

13. The method of claim 1, further comprising generating functional block usage statistics from a profile.

14. The method of claim 13, further comprising tracking usage of different processing blocks as a function of time.

15. The system of claim 1, further comprising speculatively shutting down power for one or more processing blocks and automatically switching power on for turned off processing blocks when needed.

16. The method of claim 1, further comprising using an instruction decoder to determine when power is to be applied to each power domain.

17. The method of claim 1, further comprising performing static profiling or dynamic profiling of the computer readable code to determine processing block usage.

18. The method of claim 1, further comprising automatically generating firmware or software development kit (SDK) for the custom integrated circuit to run the computer readable code.

19. The method of claim 1, further comprising compiling the computer readable code into assembly code, linking the assembly code to generate firmware for the selected architecture, and performing cycle accurate simulation of the firmware.

20. A method to manage power in a custom integrated circuit (IC) design, comprising:
   a. receiving a specification of the custom integrated circuit including computer readable code and generating a code profile of the computer readable code to determine instruction usage, wherein the profile includes a data model associates an instruction's steady state probability of execution to a topology of an execution path
   wherein the instruction contain instruction scheduler to made aware of power usage through the data model and see the true cost of scheduling instruction execution to get high performance with minimal hot spots on the chip;
   wherein the instruction scheduler is power aware in that the instruction scheduler use predicted hot spot information and map this information to virtual resource constraints so that standard off-the-shelf instruction scheduler can become power aware;
   b. creating from the data model sub-regions of a layout and for each sub-region determining a collection of intersecting execution paths yielding one or more execution path probabilities for one or more sub-region weights each with a weight distribution to estimate power hot-spot locations;
   c. automatically generating an application specific instruction set processor architecture uniquely customized to the computer readable code with a compiler-in-the-loop to compile, assemble and link code for each processor architecture iteration, the processor architecture having one or more processing blocks on the IC executing one or more instructions;
   d. determining an instruction execution sequence based on the code profile and spatially assigning the processing blocks to spread operations or activities to different areas on the IC to reduce hot spots; and
   e. synthesizing the generated architecture into a computer readable description of the custom integrated circuit for semiconductor fabrication.

* * * * *